(12) United States Patent
Brailey

(10) Patent No.: US 7,582,958 B2
(45) Date of Patent: Sep. 1, 2009

(54) SEMICONDUCTOR PACKAGE

(75) Inventor: Paul Brailey, Swansea (GB)

(73) Assignee: International Rectifier Corporation, El Segundo, CA (US)

( * ) Notice: Subject to any disclaimer, the term of this patent is extended or adjusted under 35 U.S.C. 154(b) by 26 days.

(21) Appl. No.: 11/635,950

(22) Filed: Dec. 8, 2006

(65) Prior Publication Data
US 2007/0138606 A1 Jun. 21, 2007

Related U.S. Application Data

(60) Provisional application No. 60/748,680, filed on Dec. 8, 2005.

(51) Int. Cl.
H01L 23/495 (2006.01)

(52) U.S. Cl. ............... 257/676; 257/666; 257/675; 257/678; 257/692; 257/787; 257/E23.001; 257/E23.066

(58) Field of Classification Search ......... 257/666, 257/675, 676, 678, 692, 787, E23.001, E23.066
See application file for complete search history.

(56) References Cited

U.S. PATENT DOCUMENTS

| 5,294,897 | A  | * | 3/1994  | Notani et al. ............ 333/33 |
| 5,464,950 | A  | * | 11/1995 | Horiuchi et al. ......... 174/256 |
| 5,544,412 | A  | * | 8/1996  | Romero et al. ........... 29/832 |
| 5,631,809 | A  | * | 5/1997  | Takagi et al. ............ 361/820 |
| 5,786,745 | A  | * | 7/1998  | Elliott et al. ............ 338/51 |
| 5,792,984 | A  | * | 8/1998  | Bloom .................... 174/564 |
| 5,798,287 | A  | * | 8/1998  | Ronsisvalle ............. 438/133 |
| 5,814,884 | A  | * | 9/1998  | Davis et al. ............. 257/723 |
| 5,844,308 | A  | * | 12/1998 | Dedert et al. ........... 257/692 |
| 6,040,626 | A  | * | 3/2000  | Cheah et al. ............ 257/735 |
| 6,228,468 | B1 | * | 5/2001  | Vodrahalli ............... 428/210 |
| 6,291,804 | B1 | * | 9/2001  | Fujii ....................... 219/541 |
| 6,307,272 | B1 | * | 10/2001 | Takahashi et al. ....... 257/787 |
| 6,910,635 | B1 | * | 6/2005  | Miks et al. ............... 235/487 |
| 7,190,062 | B1 | * | 3/2007  | Sheridan et al. ......... 257/686 |

* cited by examiner

Primary Examiner—Andy Huynh
(74) Attorney, Agent, or Firm—Farjami & Farjami LLP

(57) ABSTRACT

A semiconductor package which includes a plurality of leads embedded in a ceramic body, a semiconductor device electrically coupled to the leads, and a molded housing encapsulating at least the semiconductor device.

14 Claims, 8 Drawing Sheets

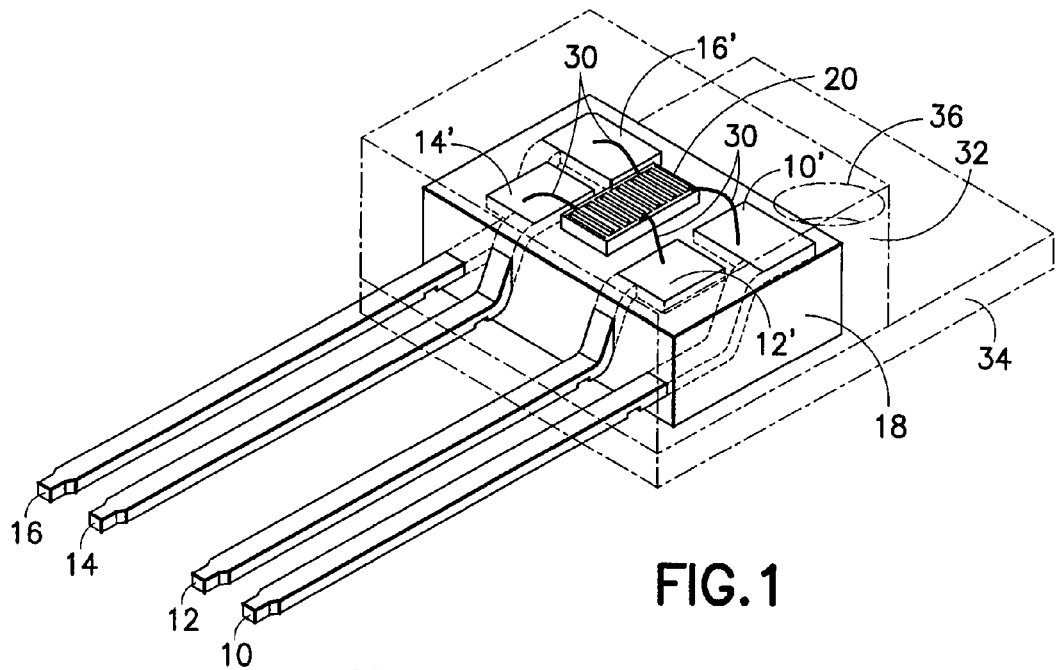
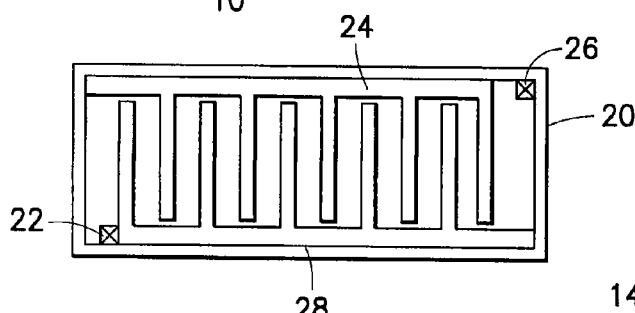
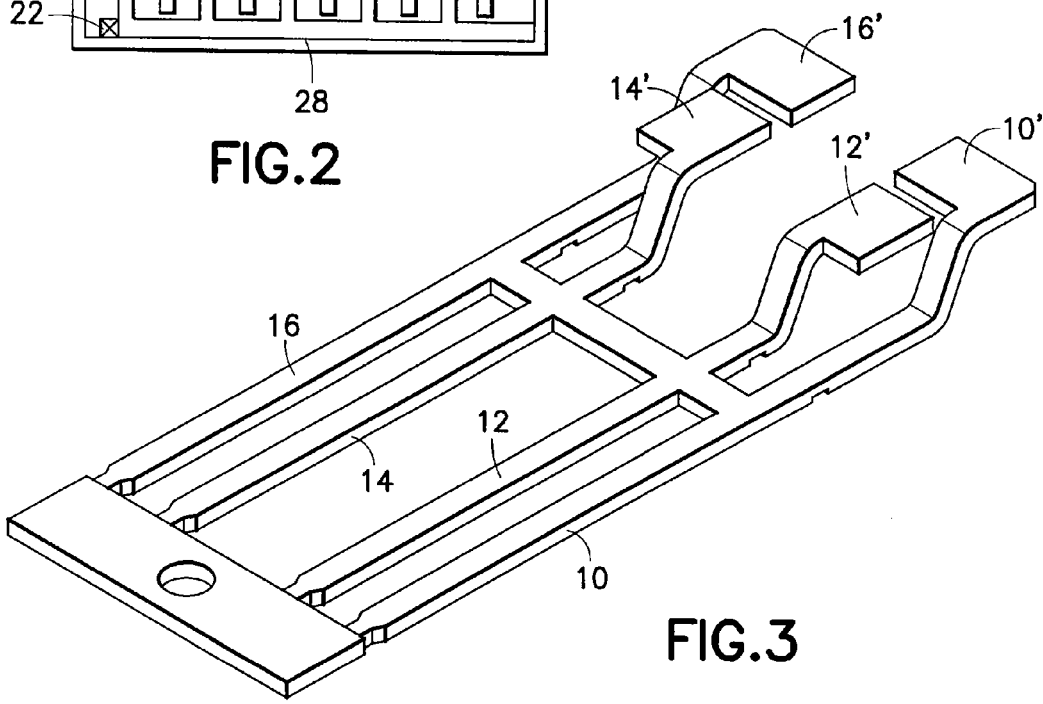
FIG.1
FIG.2
FIG.3

SEMICONDUCTOR PACKAGE

RELATED APPLICATION

This application is based on and claims priority to the U.S. Provisional Application Ser. No. 60/748,680, filed on Dec. 8, 2005, entitled Leadframe Structure With Encapsulated Insulation Body and Die Bond Pads on the Insulation Body, to which a claim of priority is hereby made and the disclosure of which is incorporated by reference.

BACKGROUND AND SUMMARY OF THE INVENTION

The present invention relates to semiconductor packages.

A semiconductor device such as a semiconductor switch (e.g. a power MOSFET) is usually packaged and then the package is integrated into an electronic circuit. A conventional package includes a plurality of leads constituting a lead frame, a semiconductor device having the electrodes thereof coupled electrically to the leads for external connection and a molded plastic housing encapsulating at least the semiconductor device and portions of the leads.

Semiconductor devices, and particularly power semiconductor devices, generate heat during operation. The heat so generated must be extracted and dissipated, otherwise the operation of the semiconductor device may be adversely affected. Conventional packages offer less than ideal heat dissipation characteristics.

Furthermore, for economic reasons it is desirable to simplify the configuration and the process for the fabrication of semiconductor packages in order to reduce the cost thereof. Conventional package fabrication may require several costly steps, particularly, in the fabrication of the lead frame, which contribute to the cost of manufacturing.

A package according to the present invention allows for improved heat extraction and dissipation, and also includes features which render the fabrication thereof simpler and less costly.

A semiconductor package according to the present invention includes a plurality of leads each having a bond pad, said leads being embedded partially in a ceramic body, a semiconductor device having a plurality electrodes disposed over the ceramic body, each electrode being electrically coupled to a respective bond pad, and a housing encapsulating at least the semiconductor device.

According to one aspect of the present invention, the ceramic body is made from a thermally conductive ceramic with a high dielectric constant such as aluminum nitride in order to improve the thermal characteristics of the package and electrical isolation.

According to another aspect of the present invention, the semiconductor device is attached to the ceramic body by an adhesive, such as epoxy or solder, and is positioned centrally relative to all the bond pads. That is, the bond pads are redistributed to surround the semiconductor device whereby the distance between the electrodes of the device and the pads may be optimally shortened.

To further enhance the thermal performance of the package the housing may be formed from a moldable ceramic. Fins may be added to the housing to improve thermal convection.

According to another aspect of the present invention the leads (including the bond pads) may have the same thickness, whereby the cost of fabrication of the package may be reduced.

According to another aspect of the present invention, at least one of the bond pads may include a chamfered corner to reduce stress and failure due to fatigue.

Other features and advantages of the present invention will become apparent from the following description of the invention which refers to the accompanying drawings.

BRIEF DESCRIPTION OF THE FIGURES

FIG. 1 illustrates a semiconductor package according to the first embodiment of the present invention.

FIG. 2 illustrates a top plan view of a semiconductor device used in a package according to the first embodiment of the present invention.

FIG. 3 illustrates a lead frame used in a package according to the present invention.

DETAILED DESCRIPTION OF THE FIGURES

Figure 4:
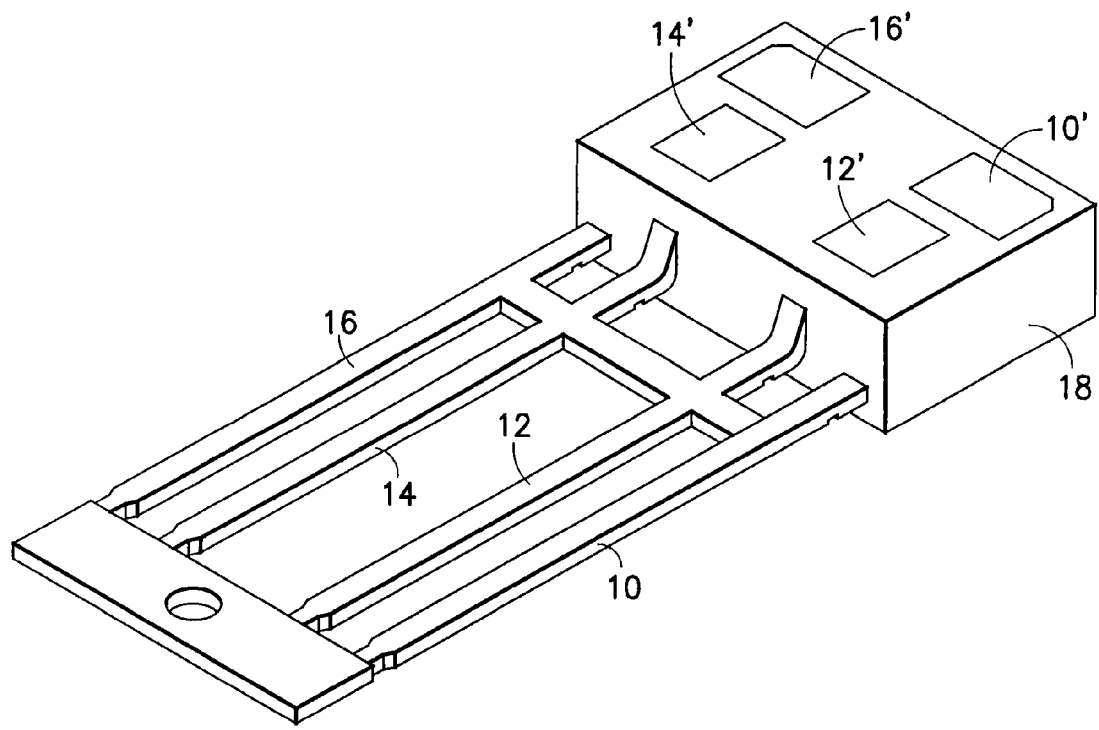
FIGS. 4-9 illustrate selected steps in the fabrication of a semiconductor package according to the first embodiment.

Referring to FIGS. 1 and 2, a semiconductor package according to the first embodiment of the present invention includes a plurality of parallel leads 10, 12, 14, 16 (constituting a lead frame) embedded at least partially in a thermally conductive ceramic body 18. Each lead 10, 12, 14, 16 includes a bond pad 10', 12', 14', 16' that includes a bond surface exposed through ceramic body 18 and ready for wirebonding or the like electrical connection. Preferably leads 10, 12, 14, 16 are of uniform thickness.

A semiconductor device 20 having a plurality of electrodes 22, 24, 26, 28 is disposed over and secured to a surface of ceramic body 18 preferably centrally positioned relative to pads 10', 12', 14', 16'. Wirebonds 30 are preferably used to electrically connect each electrode 22, 24, 26, 28 to a respective bond pad 10', 12', 14', 16', although other connection methods such as conductive straps or the like may be used without deviation from the scope and spirit of the present invention. Note that in the embodiment shown semiconductor device 20 is a III-nitride based bidirectional power semiconductor device in which all electrodes are disposed on a common surface. In such a device, electrodes 22, 26 may be control electrodes (e.g. gate electrodes), while electrodes 24, 28 may be power electrodes (e.g. source/drain electrodes). It should be noted, however, that a package configuration according to the present invention is not limited to a bidirectional device, nor is it limited to a device having electrodes on the same surface. Moreover, a package according to the present invention is not limited to III-nitride devices, and may include other types of devices including silicon or silicon-carbide based power semiconductor devices.

A package according to the first embodiment further includes a housing 32 which encapsulates at least semiconductor device 20, and preferably ceramic body 18 as well. Optionally, a tab 34 having a mounting hole 36 may be formed as a part of housing 32 during overmolding. Mounting hole 36 may be used to secure the package to a surface or a heatsink. Housing 32 may be preferably made from a moldable ceramic material.

Semiconductor device 20 may be secured to ceramic body 18 using an adhesive. For example, epoxy or solder may be used to secure semiconductor device 20 to ceramic body 18. In the event solder is preferred, and the ceramic body 18 is made of a material to which solder does not adhere, a metal insert (not shown) can be embedded in ceramic body 18 and used as a base for solder connection of device 20 to ceramic body 18. Optionally, when a metal insert is being added, a metal tab for screw mounting of the package to a circuit board, a heatsink or the like may be added.

Preferably, ceramic body 18 is made from aluminum nitride or the like material, and leads 10, 12, 14, 16 are made from nickel plated copper.

Figure 5:
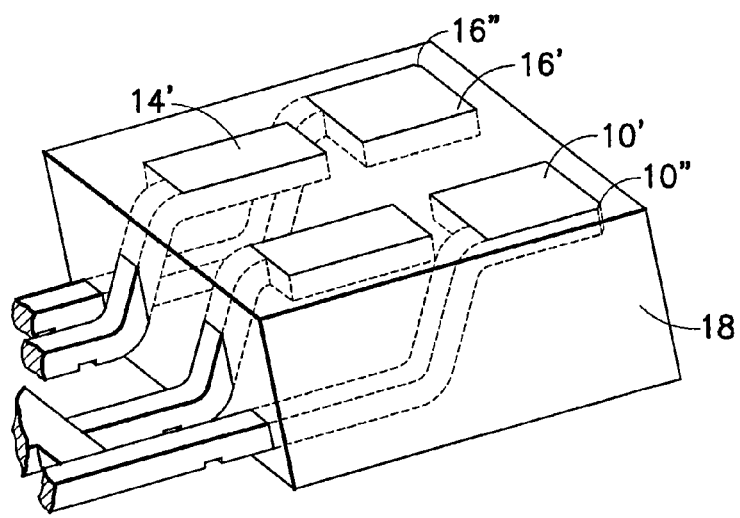

Referring to FIGS. 3-9, uncut lead frame (FIG. 3) made preferably from nickel plated copper is partially embedded in a thermally conductive ceramic body 18, for example, made from aluminum nitride (see FIG. 4). Note that bond pads 10', 12', 14', 16' are exposed through ceramic body 18, and preferably the exposed surfaces of bond pads 10', 12', 14', 16' are coplanar with the surface of ceramic body 18 through which they are exposed. Referring to FIG. 5, according to one aspect of the design, bond pads 10', 16' include chamfered corners 10", 16", which serve to reduce stress and failure due to fatigue.

Figure 6:
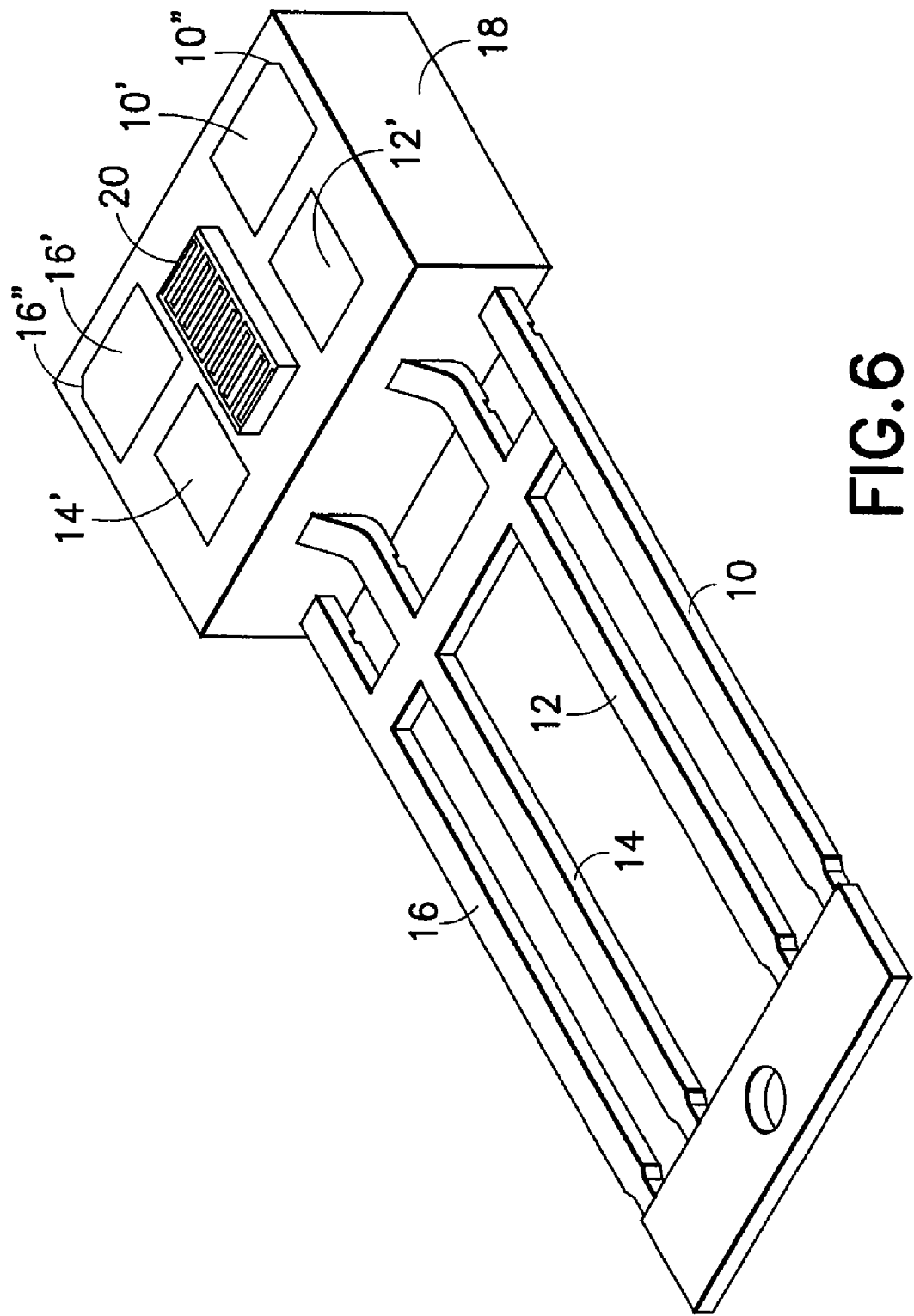
Figure 7:
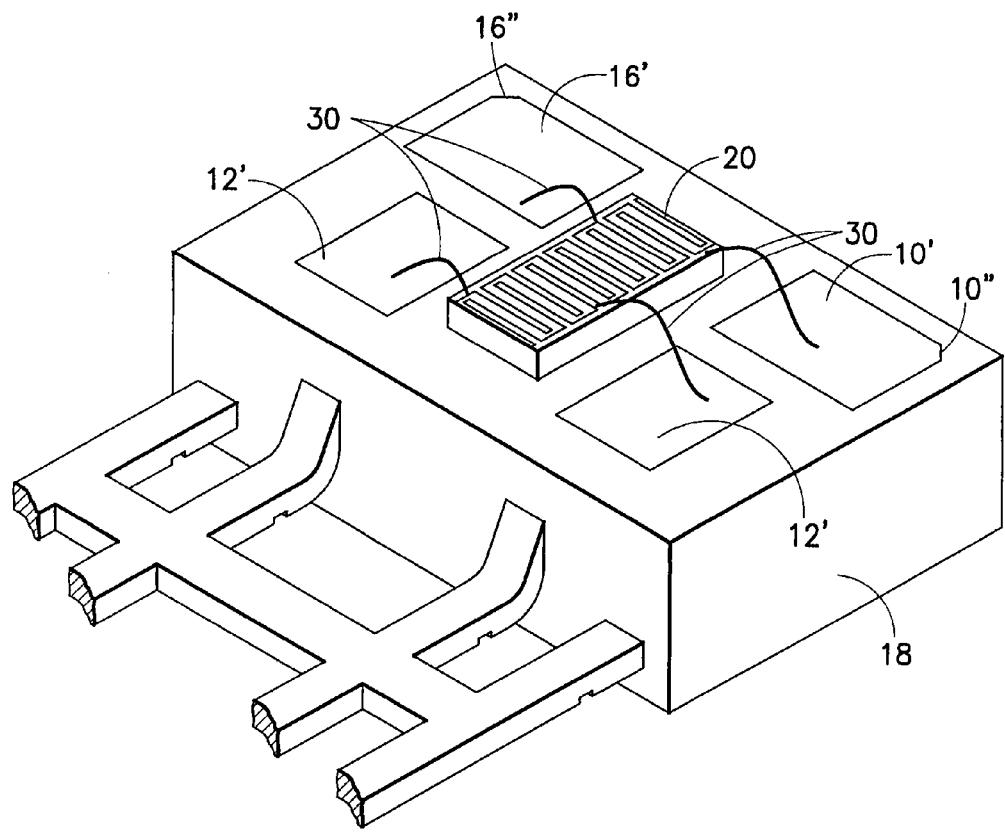
Figure 8:
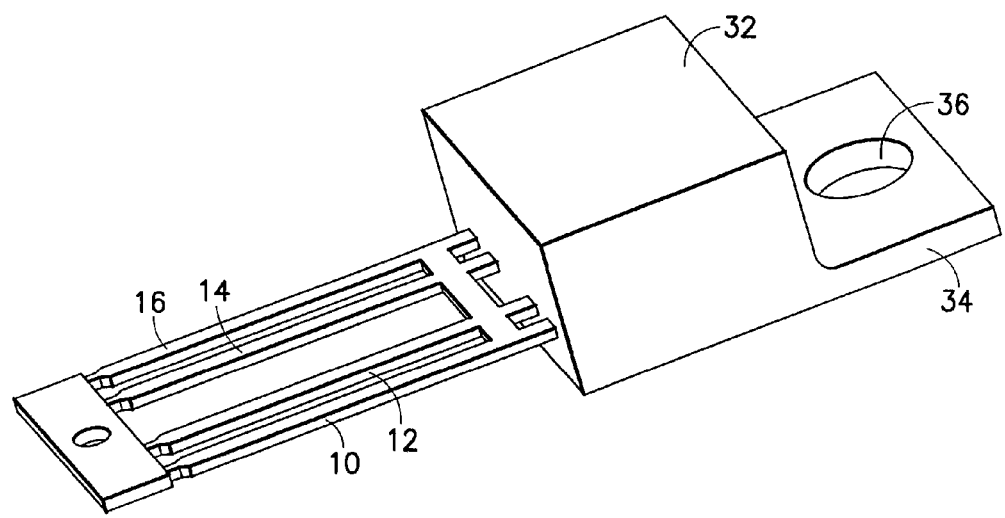
Figure 9:
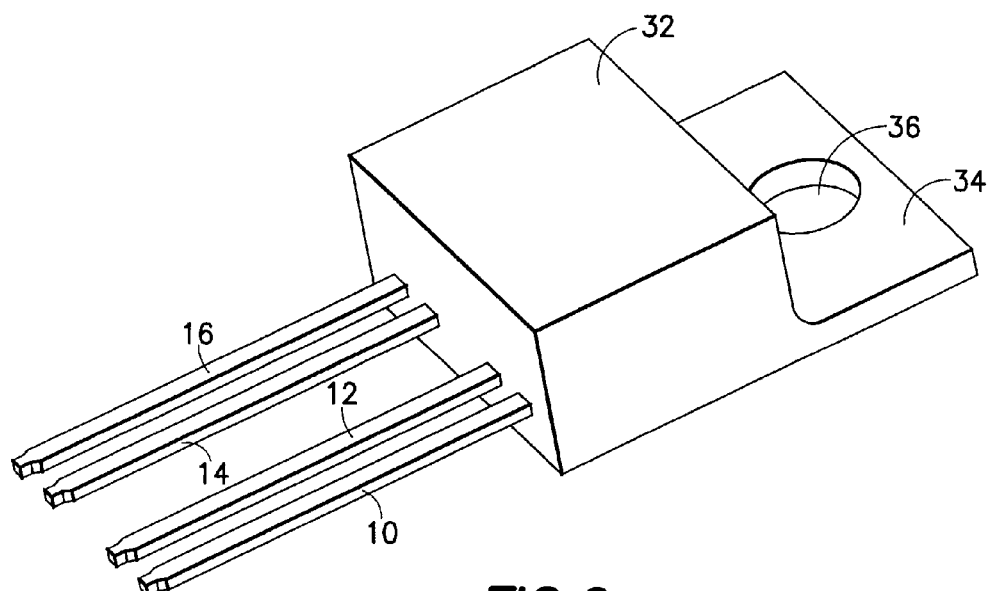

Referring next to FIG. 6, semiconductor device 20 is secured to ceramic body 18 using an adhesive or the like in any suitable manner. For example, epoxy or solder can be used to secure device 20 to ceramic body 18 as described earlier. Thereafter, electrodes of device 20 can be electrically connected to bond pads 10', 12', 14', 16' using wirebonds 30. Thereafter, the assembly is overmolded with a moldable ceramic to obtain a housing 32 as described (FIG. 8), and then the lead frame is cropped to obtain the singulated parallel leads 10, 12, 14, 16 (FIG. 9).

Figure 14:
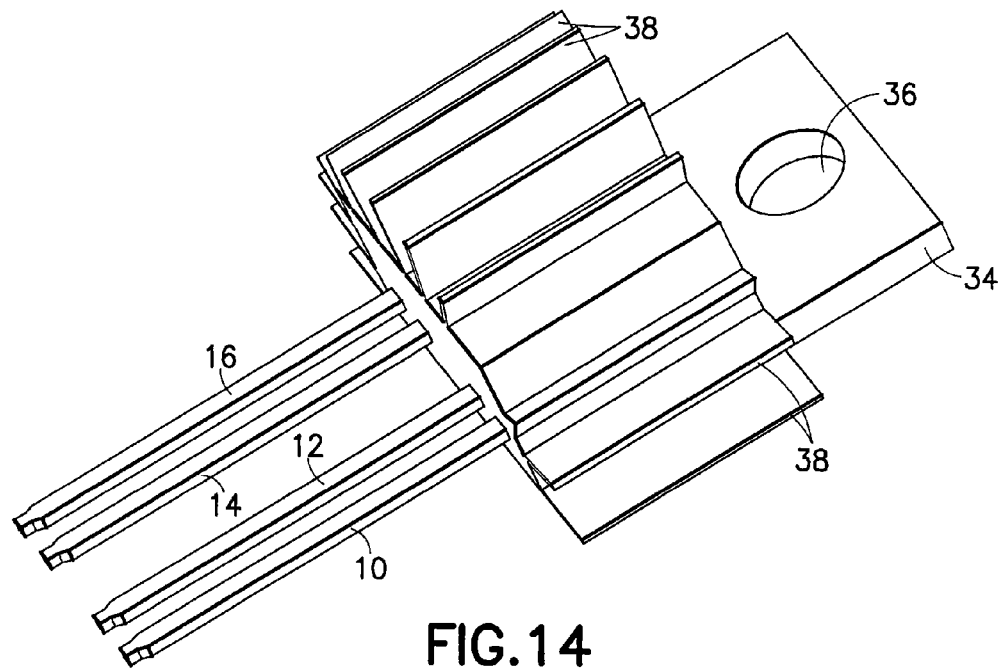
Figure 15:
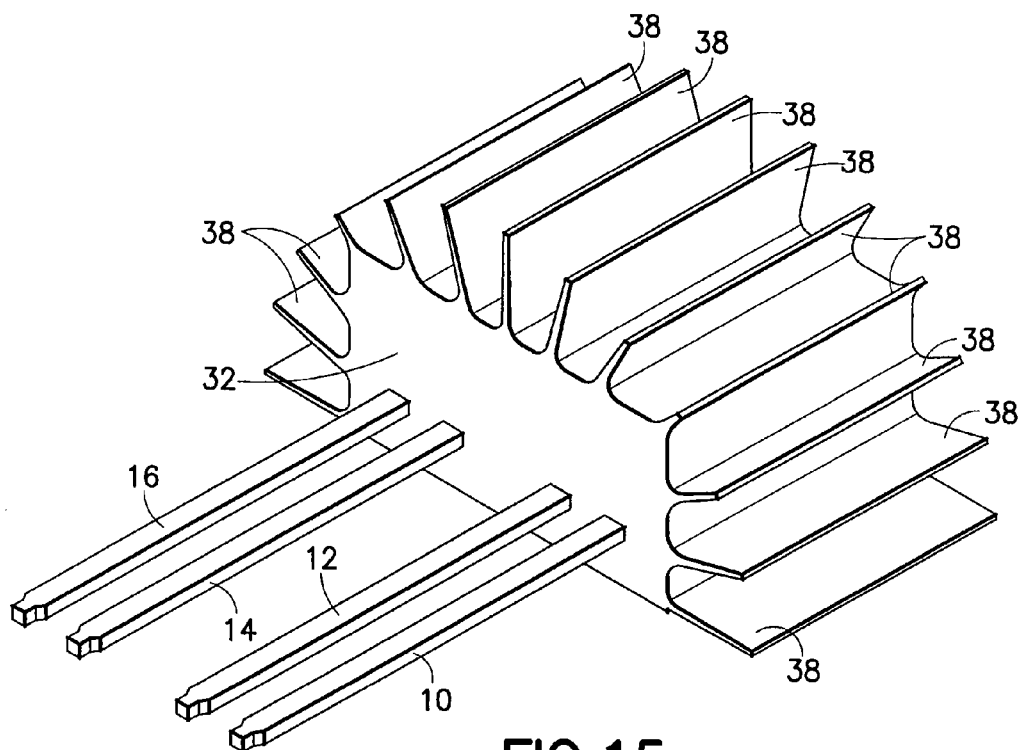

A package according to the present invention can be further enhanced by adding fins 38 to the exterior thereof. Specifically, fins 38 can be formed to extend from the exterior of housing 32 through molding or the like. That is, for example, fins 38 can be molded with housing 32. Note that fins 38 can have any suitable shape. For example, fins 38 may have an arc portion (FIGS. 10, 11, 12, 13) or may be spaced blades (FIGS. 14, 15).

Figure 16:
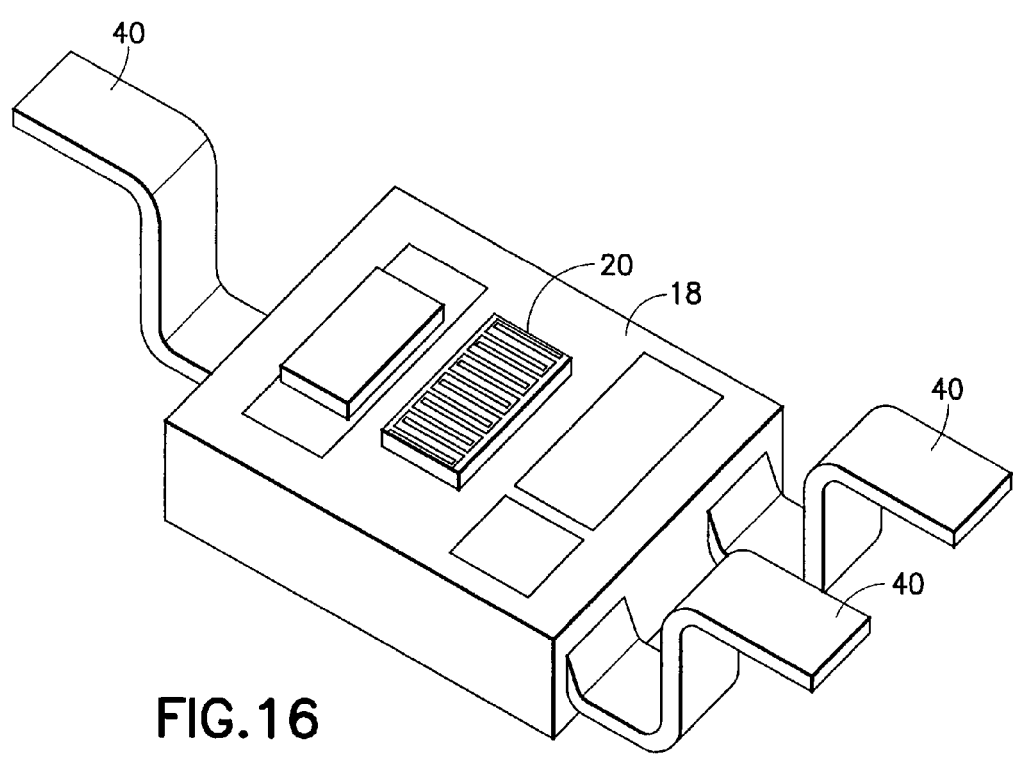
FIG. 16 illustrates a semiconductor package according to the second embodiment of the present invention having the housing thereof removed for better illustration.
Figure 10:
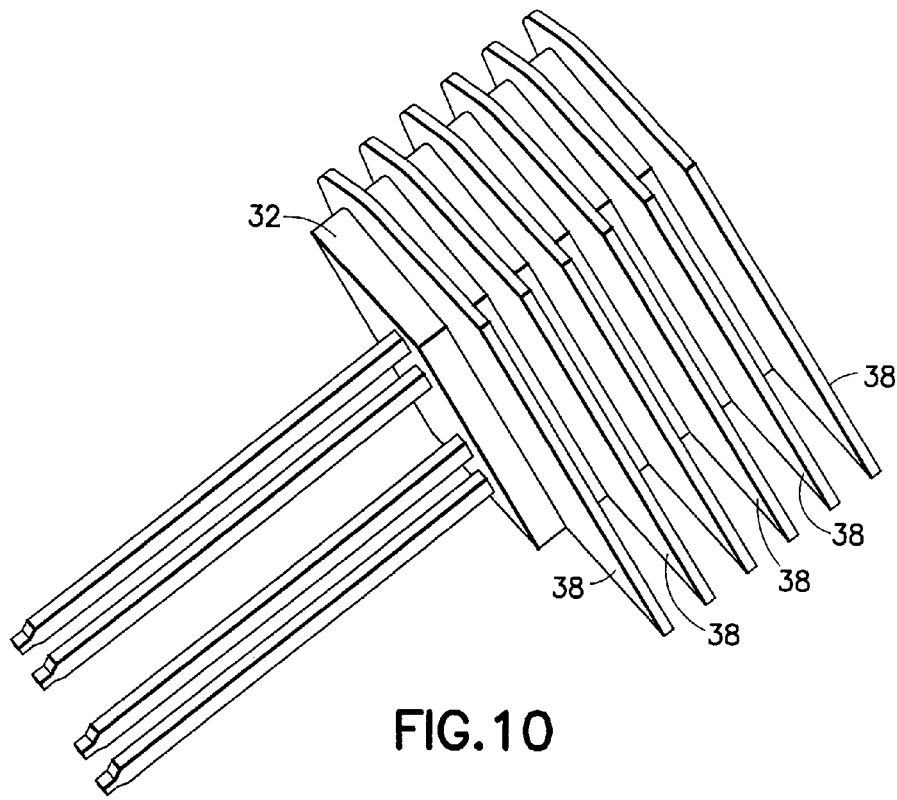
FIGS. 10-15 illustrate variations of a package according to the present invention each example including fins extending from the exterior surface of the housing thereof.
Figure 11:
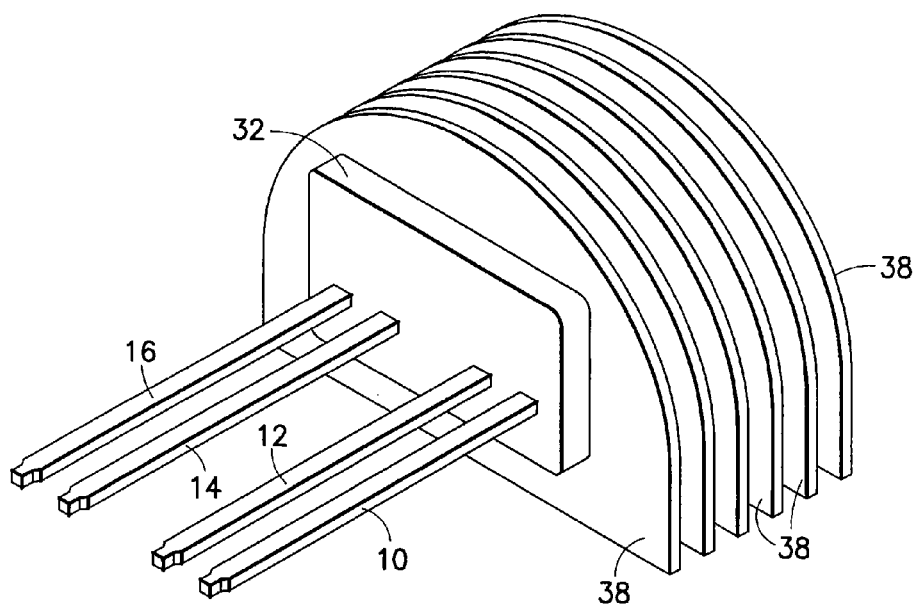
Figure 12:
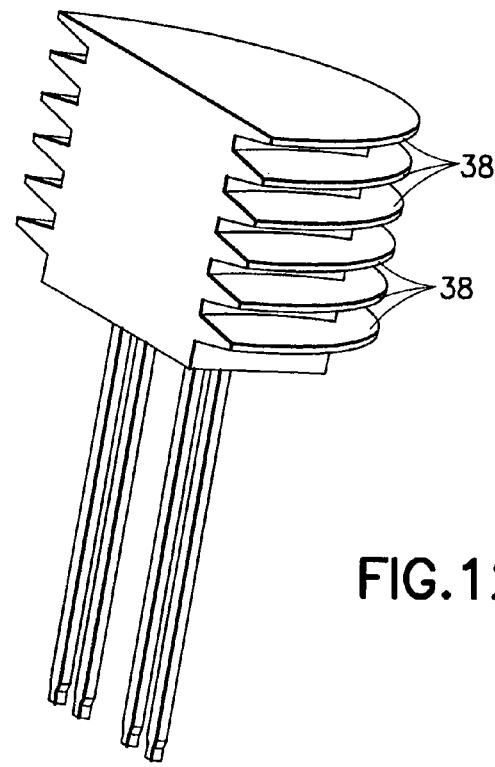
Figure 13:
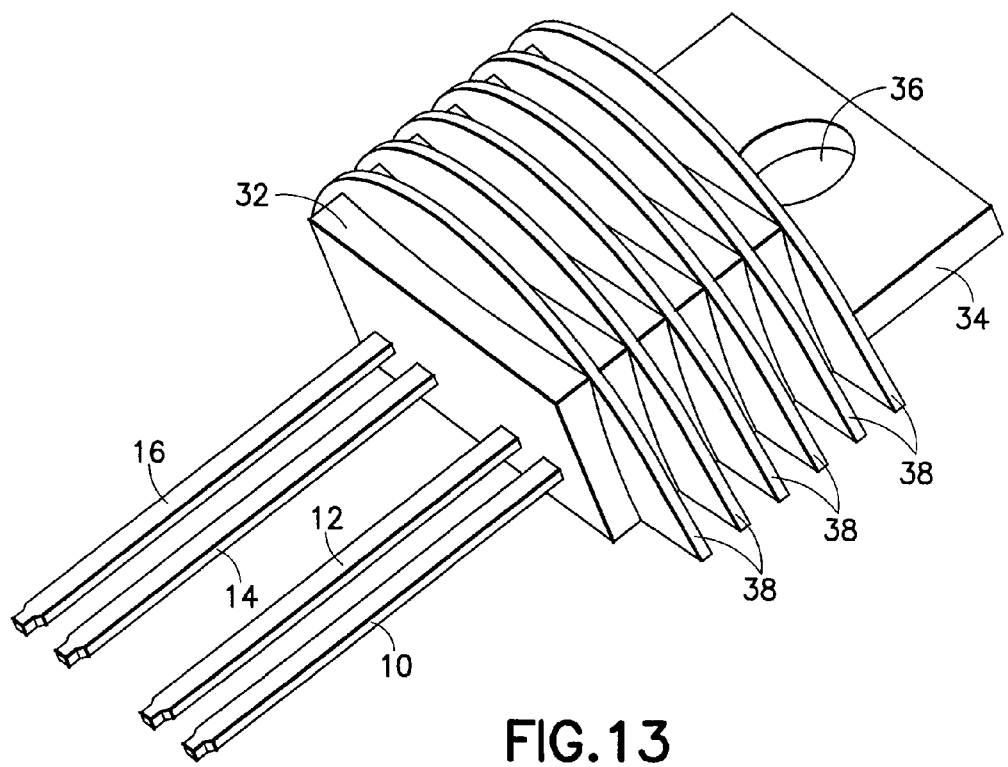

Referring next to FIG. 16, a package according to the second embodiment may include leads that do not extend from a common side of ceramic body 18, but each includes a surface 40 for surface mounting onto a conductive pad of a circuit board or the like whereby the package can be rendered surface mountable. Note that although not shown (for the purpose of clear illustration) a package according to the second embodiment may also include a molded housing 32 similar to the first embodiment. A package according to the second embodiment may include components for a cascaded rectifier.

A package configuration according to the present invention allows for improved thermal performance, simplification of lead frame design and lead frame redistribution, resulting in a simpler design and consequently less expensive manufacturing.

Many of the feature disclosed herein offer benefits compared to a conventional lead frame such as a T0220 lead frame. For example, a package according to the present invention does not require a die flag and header and is of uniform thickness which makes manufacturing easier as it does not require extra complex rolling processes to achieve the thick die flag and header region and thin legs like a conventional lead frame design. Furthermore, it would take fewer stamping, punching and pressing steps to produce a lead frame according to the present invention in that all bond pads are the same height, same thickness and are all pressed into shape along the same planes.

Furthermore, the assembly of ceramic body 18 and leads 10, 12, 14, 16 results in a combination that is akin to a lead frame which has redistributed bond pads for ease of wire bonding. Moreover, using a ceramic body 18 can allow for high thermal conductivity and high electrical isolation. That is ceramic body 18 and the lead frame embedded therein act as a large heat sink for improved cooling of semiconductor device 20, while the redistribution of bond pads around semiconductor device 20 allows for the shortening of bond wires. Shorter bond wires results in savings in material cost, faster manufacturing, and lower package resistance. Furthermore, the bonding process is easier as simple bonds can be used compared to conventional lead frames where the wirebonds have to be twisted before being attached to the bond pads. Moreover, the lead frame configuration does not require the die designers to place the gates purely on one end to make the bonding and packaging design task easier.

A major advantage of using ceramic instead of plastic for forming housing 32 is the vastly improved thermal conductivity. In essence, a 360 degree head sink has been created around the die.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor package, comprising:
a plurality of leads each having a bond pad at one end thereof, a free end at another end thereof, and an embedded portion disposed between said free end and said bond pad thereof embedded in a ceramic body, each said bond pad including a bond surface exposed at a first surface of said ceramic body and each said lead including an extending portion extending out and away from said ceramic body, said extending portion including said free end of said lead;
a semiconductor device disposed over said ceramic body, said semiconductor device including a plurality of electrodes on a first surface thereof, said plurality of electrodes including a first power electrode, a second power electrode, and at least one control electrode, each electrode being electrically coupled to a respective exposed bond surface of a respective bond pad;
an adhesive attaching said semiconductor device to said ceramic body;
a plurality of electrical connectors each having one end electrically and mechanically connected to a respective electrode of said semiconductor device at said one end thereof and another end electrically and mechanically connected to a respective bond surface of a respective lead at said another end thereof; and
a housing encapsulating at least said semiconductor device and said exposed surfaces of said bond pads, wherein said extending portion of each lead extends out and away from said housing, and wherein said free end of each said leads resides outside said ceramic body and said housing.

2. The package of claim 1, wherein said adhesive is an epoxy.

3. The package of claim 1, wherein said housing is comprised of a moldable ceramic.

4. The package of claim 1, wherein each said electrical connector comprises a wire bond.

5. The package of claim 1, wherein said electrodes are disposed on said first surface of said semiconductor device.

6. The package of claim 1, wherein said semiconductor device is a III-nitride power semiconductor device.

7. The package of claim 1, wherein said electrodes further include at least another control electrode.

8. The package of claim 1, wherein each said lead includes a surface mountable surface, wherein said surface mountable surfaces are coplanar.

9. The package of claim 1, wherein a plurality of spaced fins extend from the exterior of said housing.

10. The package of claim 1, wherein said housing includes a header having a mounting hole to allow for the mounting of said package on a substrate.

11. The package of claim 1, wherein said ceramic body is comprised of aluminum nitride.

12. The package of claim 1, wherein said leads are comprised of nickel plated copper.

13. The package of claim 1, wherein at least one of said bond pads includes a chamfered corner.

14. The package of claim 1, wherein said exposed surfaces of said bond pads are coplanar with a surface of said ceramic body.

* * * * *